United States Patent [19]

Hiraga et al.

[11] Patent Number: 4,806,773
[45] Date of Patent: Feb. 21, 1989

[54] WAFER POSITION DETECTING METHOD AND APPARATUS

[75] Inventors: Ryozo Hiraga, Yokohama; Hiroshi Echizen, Tokyo, both of Japan

[73] Assignee: Canon Kabushiki Kaisha, Tokyo, Japan

[21] Appl. No.: 94,076

[22] Filed: Sep. 4, 1987

Related U.S. Application Data

[63] Continuation of Ser. No. 787,179, Oct. 15, 1985, abandoned.

[30] Foreign Application Priority Data

Oct. 18, 1984 [JP] Japan .................................. 59-219087
Oct. 19, 1984 [JP] Japan .................................. 59-220984
Oct. 19, 1984 [JP] Japan .................................. 59-220985

[51] Int. Cl.$^4$ .......................................... G01N 21/80
[52] U.S. Cl. ...................................... 250/548; 250/561
[58] Field of Search ...................... 250/548, 551, 561; 355/41

[56] References Cited

U.S. PATENT DOCUMENTS 3,902,615  9/1975  Levy et al. ............................ 214/301
4,461,567  7/1984  Mayer ..................................... 355/41

Primary Examiner—Gene Wan
Attorney, Agent, or Firm—Morgan & Finnegan

[57] ABSTRACT

A wafer position detecting device includes a laser source, a mirror for receiving the laser beam and reflecting it to a photosensor. Optically between the laser source and the photosensor, there is located a wafer cassette containing plural semiconductor wafers in the manner that the optical path of the laser is parallel to the surface of the wafer in the cassette, namely that the laser beam can incident on the edge of the wafer parallel to the surface thereof. Relative movement is caused between the wafer and the laser beam in the direction perpendicular to the wafer surface. The space or the wafer can be detected on the basis of the output of the photosensor.

8 Claims, 4 Drawing Sheets

4,806,773

WAFER POSITION DETECTING METHOD AND APPARATUS

This is a continuation of co-pending application Ser. No. 06/787,179, filed on Oct. 15, 1985 now abandoned.

FIELD OF THE INVENTION AND RELATED ART

The present invention relates to a method of wafer position detecting and a device therefor, more particularly to method and apparatus usable with a wafer pick-up device in the field of semiconductor circuit manufacturing.

Generally, an apparatus for processing, measuring or inspecting a wafer for semiconductor circuit manufacturing, is operated with a wafer cassette which is capable of accommodating plural wafers. A wafer is supplied from the cassette to the apparatus where it is subjected to the processing, measurement or inspection, and thereafter, is returned into the cassette. The cassette accommodates the processed wafers and is transported to the next processing station, while containing all the wafers.

In order to take the wafer out of the cassette and/or put it back into the cassette, it is conventional that a wafer hand type feeding device is used.

FIG. 1 is a top plan view of a wafer handler of a pantagraph which may be considered as being usable for the purpose of handling the wafer. The following description will be made, referring only to one half for the sake of simplicity when it is proper. The wafer handler of FIG. 1 comprises a couple of first arms AM1 and a couple of second arms AM2 articulated with the respective first arms AM1 by pins 42, respectively. The first arm AM1 is pivotably connected to an unshown base plate by shaft or pin G1, adjacent that end thereof which is opposite to the end where it is articulated with the second arm AM2. The wafer handler further comprises a finger FG for carrying a wafer WF. To the finger FG, the second arm AM2 is pivotably connected adjacent that end of the second arm AM2 which is the opposite to the end where it is articulated to the first arm AM1. Thus, the wafer handler constitutes a pantagraph type linkage. The shaft G1 is driven by an output shaft of an unshown motor. The shafts G1 rotate in the directions opposite to each other.

FIG. 1 shows the state of the wafer handler wherein it is expanded ultimately in one direction (rightwardly as seen in the Figure) and wherein the first and second arms AM1 and AM2 extend along two parallel lines. In use with a wafer carrier or wafer cassette WK, the finger FG of the wafer handler is placed below a wafer WF in the cassette. When the motor rotates in a direction, the pantagraph linkage collapses because the first arms AM1 and AM2 rotate symmetrically away from each other about the shafts G1, respectively, and the rotation of the first arms AM1 rotate the second arms AM2 symmetrically away from each other. With the rotation of the motor, the pantagraph linkage collapses continuously, until the arms come to take the most collapsed or folded position wherein all the arms are on one line, that is, the line perpendicular to the lines along which the ultimately expanded arms extend, as shown in FIG. 2. In this state, the second arm AM2 is overlaid above the first arm AM1. During the collapse of the linkage, the finger FG is moved linearly toward the center between the shafts G1, and the wafer thereon is taken out of the wafer cassette WK.

Usually, a plurality of wafers are accommodated in the wafer cassette with a space between adjacent ones. It is necessary, therefore, the positions of the wafers are detected prior to inserting the finger into the space between adjacent wafers in order to allow correct insertion into the space without damage to the wafer or wafers.

SUMMARY OF THE INVENTION

Accordingly, it is a principal object of the present invention to provide wafer position detecting method and device which is conveniently usable with a wafer cassette or a wafer handling apparatus. In this specification, the detection of the wafer includes detection of a space therebetween in the light of the purpose of the detection.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
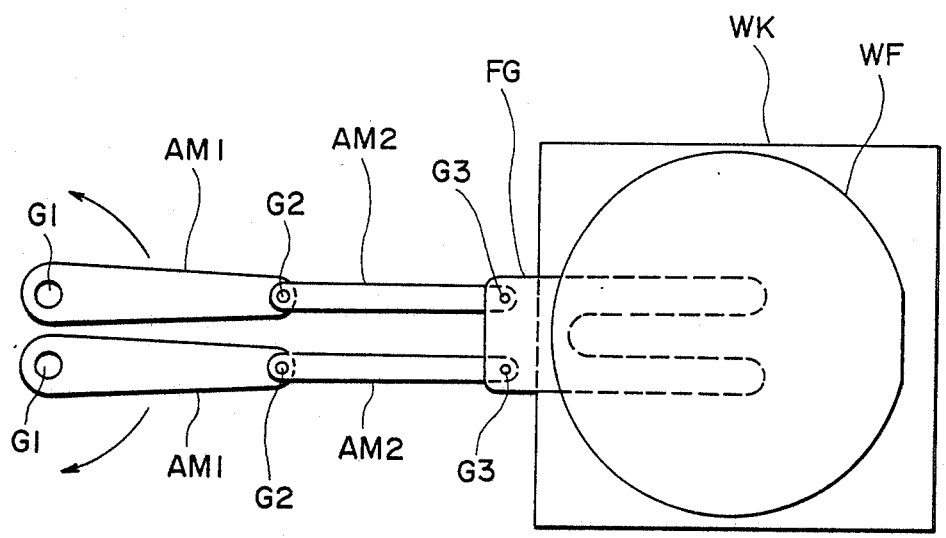
FIG. 1 is a plan view of a pantagraph wafer handler which is conventional.
Figure 2:
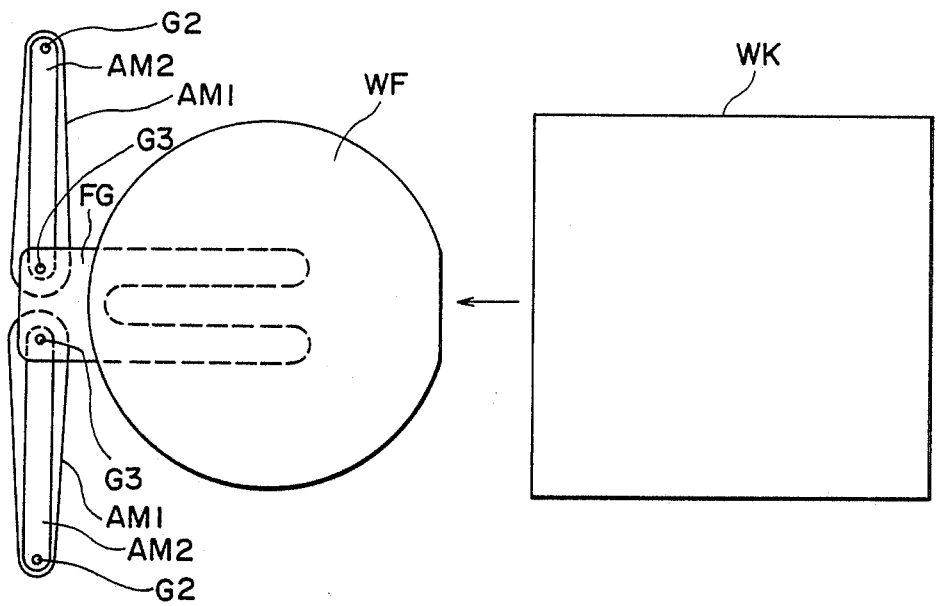
FIG. 2 is a plan view of the wafer handler of FIG. 1 when it is collapsed.
Figure 3:
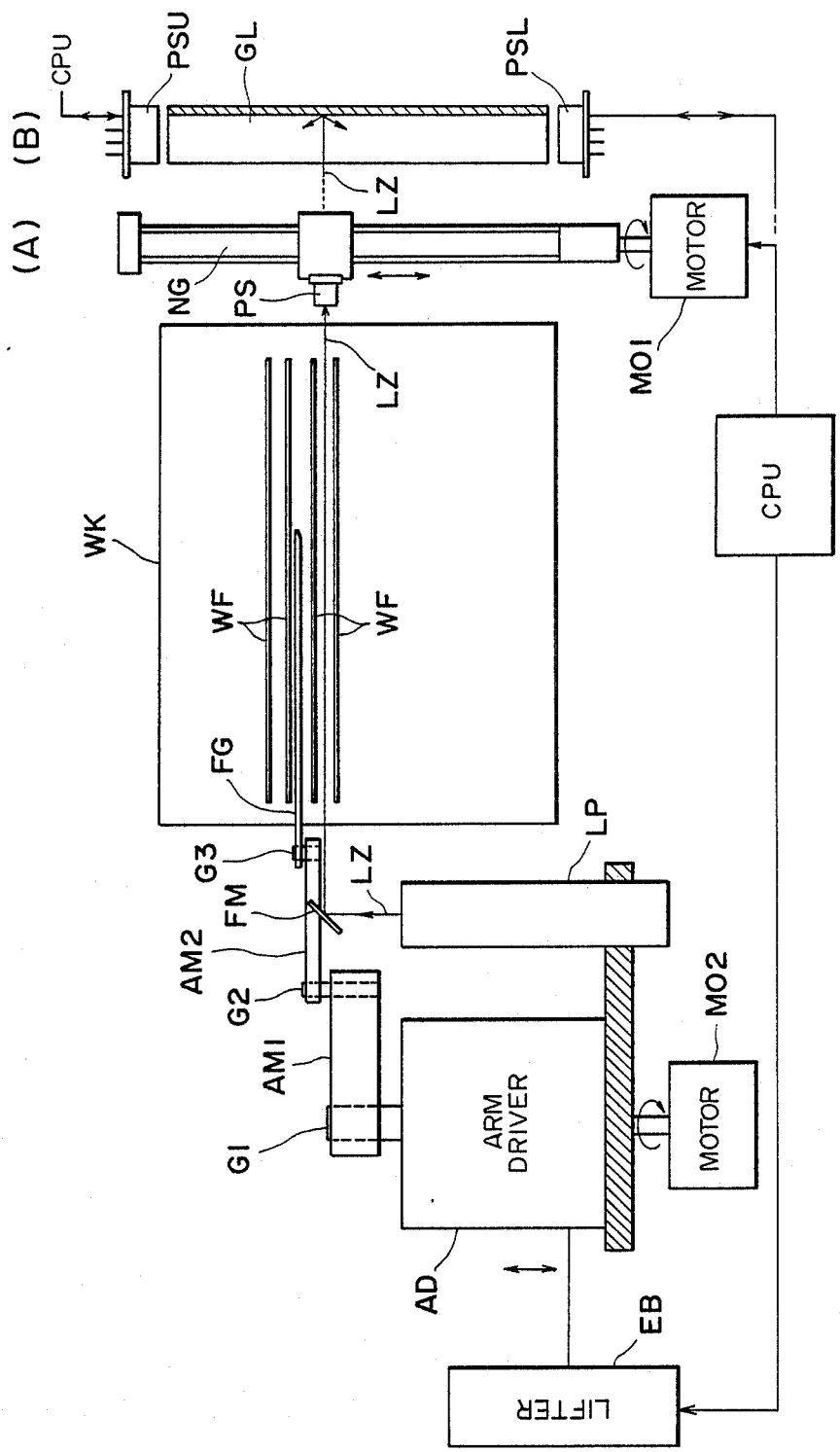
FIG. 3 is a partly broken side view of a wafer handler incorporating the wafer position detecting device according to an embodiment of the present invention.
Figure 4:
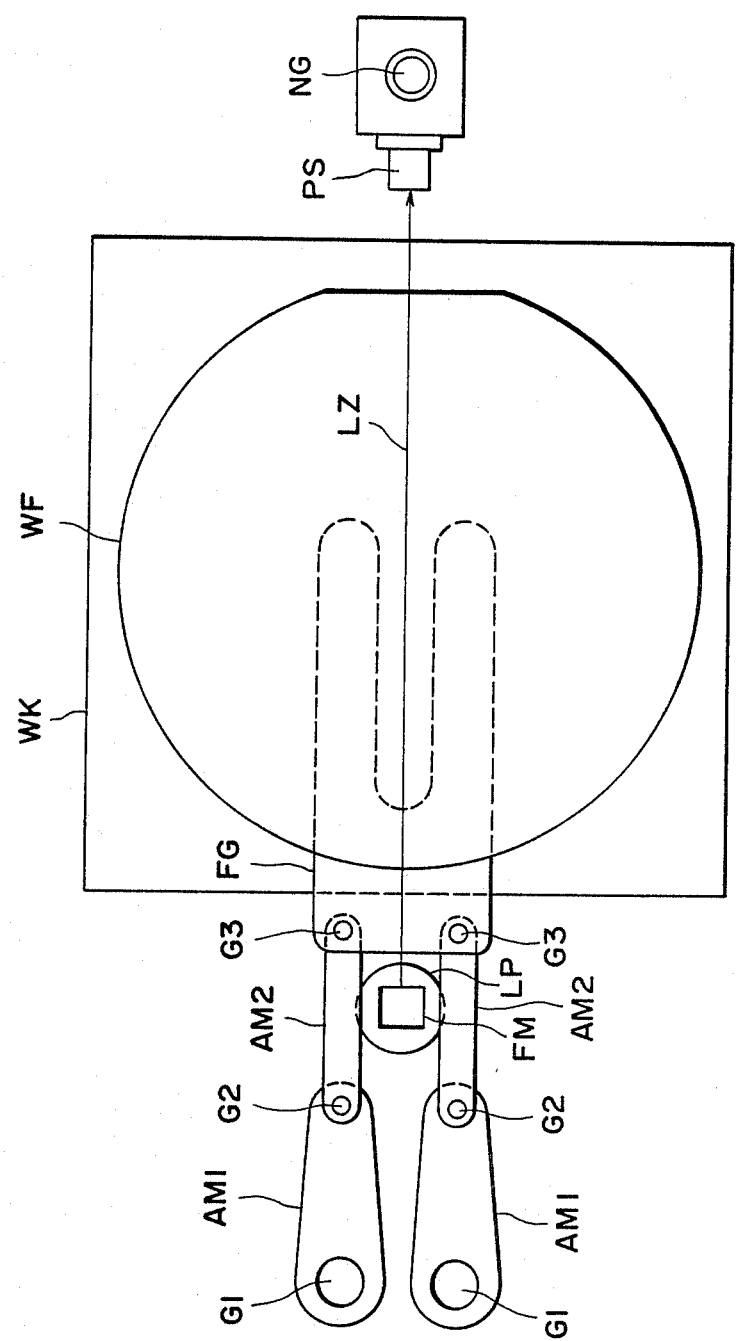
FIG. 4 is a plan view of the wafer handler of FIG. 3.

Referring to FIGS. 3 and 4, there is shown a wafer handler provided with a wafer position detecting device according to an embodiment of the present invention. FIGS. 3 and 4 are a side view and a plan view, respectively. In those Figures, a wafer cassette WK is also shown as being used with the wafer handler. The wafer cassette WK contains a plurality of wafers with a space between adjacent ones. The wafer handler in this embodiment may have the same structure as described hereinbefore with the exception that it is equipped with the wafer position detecting system. The system may be incorporated in another type of a wafer handler.

The wafer position detecting system comprises a laser source LP, a total reflection mirror FM for direction the laser beam LZ produced by the laser source LP to the wafer, and a photosensor PS disposed behind the wafer cassette WK (the side opposite to where the beam enters the cassette) to detect the laser beam directed thereto by way of the total reflection mirror FM. The laser beam LZ is incident on that edge of the wafer, if disposed across the optical path of the beam, which is near the mirror FM.

The position, more particularly, the level of the photosensor PS is controlled so that it is at the same level as that of the finger FG. For this purpose, the elevator is provided to lift and lower the photosensor PS, wherein the elevator is driven by a motor MO1 which is driven in synchronism with an elevator EB for lifting and lowering the finger FG. More particularly, in this embodiment, a control device gives instruction signals to the elevator EB and the motor MO1, simultaneously. The elevator for the photosensor PS includes a screw NG driven by the motor MO1 and a photosensor supporting member engaged with the screw NG. Instead of the motor MO1, a belt or another mechanical element may be used to transmit a driving force to the screw NG from the elevator EB, if they are properly synchronized.

The total reflection mirror FM in this embodiment is supported on the second arms so as to keep its level when the fingers FG are moved up and down. Although, the mirror FM is shown as being fairly large for the purpose of illustration, it is actually small enough not to interfere with the second arms AM2, when they are collapsed. It is preferable that the level of the finger FG and that of the laser optical path are as close as possible, so as to eliminate the necessity of correction to compensate the level difference therebetween. The laser beam, among other light beams, is employed because of its high rectilinear directivity, which is suitable for detecting an object having a rectilinear cross-section.

Figure 5A:
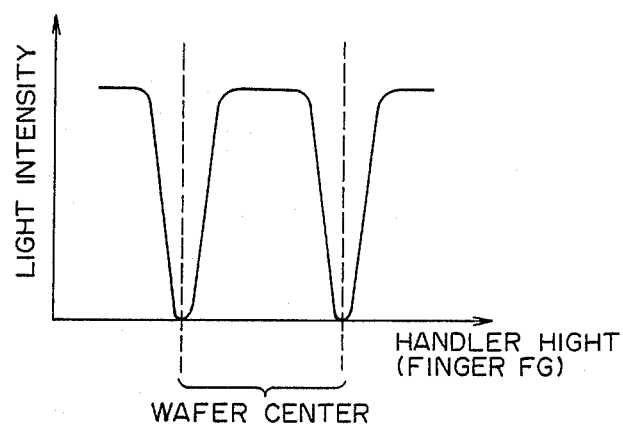
FIG. 5A is a graph showing the relation between a photosensor output and a position of a wafer in Figure 3 embodiment.

In operation, the finger FG is lowered, for example, after the pantagraph linkage is collapsed. If there is a wafer, the laser beam LZ is blocked by the wafer, so that the quantity of the light incident on the photosensor PS decreases. When there is no wafer, the light quantity increases. Thus, the position of the wafer or the space can be detected. The light intensity sensed by the photosensor PS is shown in FIG. 5A. The information of the wafer is stored in a memory, which is read out when the finger FG is moved up or down.

When another light other than a laser, such as the light emitted by LED or the like, the beam from the light source diverges more or less, it will be difficult to detect that the intended wafer blocks the optical path of the light.

It is possible to observe the edge of the wafer by a TV camera for example. However, in this case, it is required to focus the camera lens. Since the wafers WF accommodated in the cassette WK vary in the position in the direction of wafer movement for taking them out or putting them back, which leads to the difficulty in correct focusing. Therefore, correct position detection would be difficult. Additionally, a TV camera is costly, bulky and complicated in structure.

The wafer position detecting device using a laser beam is advantageous in that it is not influenced by the adjacent wafers WF since the optical path is rectilinear; in that the focusing is not necessary and in that the accuracy of detection is not influenced by the variation in the position of the wafers accommodated in the wafer cassette WK.

The wafer handler is provided with a hand arm driver AD for collapsing and expanding the hand arms AM1 and AM2 to withdraw the wafer from, and insert it into, the wafer cassette. The wafer handler is further provided with a motor MO2 to rotate the wafer supported on the finger FG to change the direction of the wafer.

FIG. 3 also shows a second embodiment by reference (B) in the righthand position of this Figure. This embodiment is the same as the foregoing embodiment with the exception that the mechanism which is behind the wafer cassette and which includes the photosensor PS is replaced with the one indicated by (B). Behind the wafer cassette WK in this embodiment, there are a glass rod GL and a photosensor PSL which is effective to sense the laser beam incident on the glass rod GL, which is a glass rod having at least partly a surface roughly abraded. The top of the rod is cut perpendicularly in this embodiment, and it is preferably that the top end surface is coated with reflective film (In this embodiment, the top photosensor PSU is not employed, which will be described hereinafter). As an alternative, the entire surface of the rod may be coated with reflective material, with the exception of a slit for receiving the laser beam and a bottom portion through which the photosensor PSL receives the light.

In operation, the wafer handler moves upwardly, for example, the wafer intercepts the laser beam, if the wafer is in the optical path of the laser. Then, no beam is incident on the rod GL, and, therefore, the photosensor PSL receives hardly any light. If there is no wafer in the optical path, the photosensor PSL receives the light. Therefore, the least quantity of light received thereby represents the center of the wafer thickness, as in the case of the first embodiment.

Figure 5B:
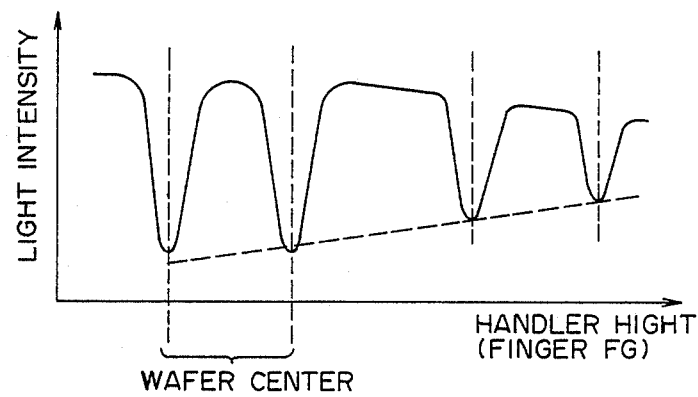
FIG. 5B is a graph showing the relation between a photosensor output and a position of a wafer in another embodiment.

FIG. 5B shows the relation between the level (height) of the wafer handler and the intensity of the light detected by the photosensor PSL disposed opposed to the lower longitudinal end of the rod GL. When the position (level) at which the laser beam is incident on the rod GL, is remote from the photosensor PSL, the intensity of light received by the photosensor PSL is low. Therefore, the difference in the intensity change is small. This means that the sensitivity of wafer detection is slow in the position which is distant from the photosensor PSL, if the photosensor is provided only at the bottom.

This embodiment is preferably so modified that two photosensors PSL and PSU are provided opposed to either ends of the rod GL, and the outputs thereof are added. Because of this, when the output of one of the sensors PSL is relatively low, that of the other is relatively high. Therefore, the sum of them becomes flat, so that correct position detection becomes possible irrespective of the level at which the finger FG is positioned.

Figure 6:
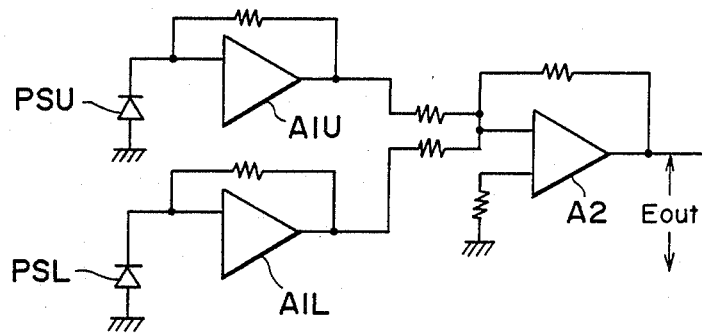
FIG. 6 shows an example of a circuit for correcting the output shown in FIG. 5B.

FIG. 6 shows the circuit for adding the outputs of the two photosensors PSL and PSU. The circuit includes current-voltaged transducing circuits A1U, A1L for transducing the photo-currents of the photosensors PSU and PSL to the respective voltages, which are added by an adding circuit A2.

While the invention has been described with reference to the structures disclosed herein, it is not confined to the details set forth and this application is intended to cover such modifications or charges as may come within the purpose of the improvements or the scope of the following claims.

What is claimed is:

1. A sheet-like member conveying apparatus for sheet-like members stacked with clearances between adjacent ones in a cassette, comprising:
   carrying means for carrying the sheet-like members;
   driving means for moving said carrying means in a stacking direction of the sheet-like members, said stacking direction being substantially perpendicular to the surfaces of the sheet-like members;

means for directing a beam toward one edge side of the sheet-like members, said beam directing means being movable together with movement of said carrying means by said driving means;

means for detecting the beam coming through the clearances to produce an output signal representative of presence or absence of the sheet-like member, said detecting means being disposed at another edge side of the sheet-like members which is opposite to said one edge side; and means, responsive to the output signal of said directing means, for controlling said driving means to determine the position of said carrying means in the stacking direction upon an operation of said carrying means.

2. An apparatus according to claim 1, wherein said carrying means includes a finger insertable into the clearances and a hand for inserting the finger into, and retracting the same from, the clearances.

3. An apparatus according to claim 2 wherein said beam directing means includes a beam reflecting mirror integral with said carrying means.

4. An apparatus according to claim 1, wherein said detecting means includes a light receiving element and means for moving the light receiving element together with movement of said carrying means.

5. An appartus according to claim 1, wherein said detecting means includes a light receiving element and light reflecting means for directing a beam passing through the clearances to the light receiving element.

6. An apparatus according to claim 5, wherein said detecting means includes plural light detecting elements at different positions.

7. An apparatus according to claim 6, wherein said detecting means includes a circuit for combining outputs of said detecting elements.

8. A sheet-like member conveying apparatus for sheet-like members stacked with clearances between adjacent ones in a cassette, comprising:

a laser source for producing a laser beam;

a beam reflecting means for reflecting the laser beam;

carrying means for carrying the sheet-like members;

driving means, disposed adjacent to one edge side of the sheet-like members, for moving said carrying means and said beam reflecting means in a direction of the stacking of the sheet-like members, said stacking direction being substantially perpendicular to the surfaces of the sheet-like members;

means for detecting the beam coming through the clearances to produce an output signal representative of presence or absense of the sheet-like member; and means, responsive to the output signal of said detecting means, for controlling said driving means to determine the position of said carrying means in the stacking direction upon an operation of said carrying means.

* * * * *